(12) United States Patent
Doris et al.

(10) Patent No.: US 6,905,941 B2
(45) Date of Patent: Jun. 14, 2005

(54) STRUCTURE AND METHOD TO FABRICATE ULTRA-THIN SI CHANNEL DEVICES

(75) Inventors: Bruce B. Doris, Brewster, NY (US); Thomas S. Kanarsky, Hopewell Junction, NY (US); Meikei Ieong, Wappingers Falls, NY (US); Wesley C. Natzle, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,069

(22) Filed: Jun. 2, 2003

(65) Prior Publication Data

US 2004/0241981 A1  Dec. 2, 2004

(51) Int. Cl.[7] ............................................... H01L 21/76
(52) U.S. Cl. ....................................... 438/424; 438/425
(58) Field of Search ................................. 438/424, 425

(56) References Cited

U.S. PATENT DOCUMENTS

| | | | |
|---|---|---|---|
| 5,766,971 A | * | 6/1998 | Ahlgren et al. ............. 438/296 |
| 5,838,055 A | | 11/1998 | Kleinhenz et al. |
| 5,876,879 A | | 3/1999 | Kleinhenz et al. |
| 6,074,951 A | | 6/2000 | Kleinhenz et al. |
| 6,319,794 B1 | * | 11/2001 | Akatsu et al. ............. 438/424 |
| 6,541,351 B1 | * | 4/2003 | Bartlau et al. ............. 438/426 |
| 2002/0022308 A1 | * | 2/2002 | Ahn et al. .................. 438/164 |

* cited by examiner

Primary Examiner—Thao P. Le
(74) Attorney, Agent, or Firm—Scully, Scott, Murphy & Presser; Jay H. Anderson, Esq.

(57) ABSTRACT

A method for preventing polysilicon stringer formation under the active device area of an isolated ultra-thin Si channel device is provided. The method utilizes a chemical oxide removal (COR) processing step to prevent stinger formation, instead of a conventional wet etch process wherein a chemical etchant such as HF is employed. A silicon-on-insulator (SOI) structure is also provided. The structure includes at least a top Si-containing layer located on a buried insulating layer; and an oxide filled trench isolation region located in the top Si-containing layer and a portion of the buried insulating layer. No undercut regions are located beneath the top Si-containing layer.

14 Claims, 8 Drawing Sheets

STRUCTURE AND METHOD TO FABRICATE ULTRA-THIN SI CHANNEL DEVICES

BACKGROUND OF INVENTION

The present invention relates to semiconductor integrated circuit devices as well as their fabrication, and more particularly to isolated ultra-thin Si channel devices having a channel thickness of less than about 20 nm and a method to fabricate such isolated ultra-thin Si channel devices.

In semiconductor processing, silicon-on-insulator (SOI) technology is becoming increasingly important since it permits the formation of high-speed integrated circuits. In SOI technology, a buried insulating layer electrically isolates a top Si-containing layer from a bottom Si-containing layer. The top Si-containing layer, which is oftentimes referred to in the art as the SOI layer, is generally the area in which active devices such as transistors are formed. Devices formed using SOI technology offer many advantages over their bulk Si counterparts including, for example, higher performance, absence of latch-up, higher packing density and low voltage applications.

In the semiconductor industry, the SOI thickness has been scaled down in every SOI device technology generation. Current technology trends are for providing SOI devices that have ultra-thin Si channels. Ultra-thin Si channel devices, which are formed in the top Si-containing layer of an SOI substrate, have demonstrated excellent scalability. The term "ultra-thin" is used throughout this application to denote a channel region having a vertical thickness of less than about 20 nm.

Although the ultra-thin Si channel device is acceptable, device isolation is one of the challenges for the manufacturer. The problem occurs during wet cleaning which can undercut the thin SOI layer and create a region under the active area that can be filled with gate polySi during deposition. Since the poly-Si is trapped under the active area, it cannot be etched during the gate stack etch and thus causes shorting between the gates lying on the same active area. This problem can be divided into two cases: The first case is when the shallow trench isolation (STI) is higher than the active device region, and the second case is when the STI is lower than the active device region. Both cases can lead to shorting if prior art processing is employed.

FIGS. 1A–1H show the basic processing steps that are employed in forming a transistor having an ultra-thin device channel. FIG. 1A shows an initial structure of the prior art process in which pad stack 18 is formed atop an upper surface of an SOI substrate 10. The SOI substrate 10 includes a bottom Si-containing layer 12, a buried insulating layer 14 and a top Si-containing layer 16. The pad stack 18 includes an oxide layer 20 and a nitride layer 22 overlying the oxide layer 20.

FIG. 1B shows the structure that is formed after trench 24 has been formed into the structure shown in FIG. 1A. The trench 24 is formed through nitride layer 22, oxide layer 20, and top Si-containing layer 16 stopping within the buried insulating layer 14. The structure shown in FIG. 1B is formed by lithography and etching.

Next, the pad oxide layer 20 is removed utilizing a conventional selective wet etch process in which a chemical etchant such as hot hydrofluoric (HF) acid is employed to remove the oxide from the structure. After the pad oxide is removed, a sacrificial oxidation and sacrificial oxide removal process is carried out. The oxides are typically formed by thermal processes, while the oxide removal is accomplished by etching in a wet HF acid mixture. Additionally, many state of the art circuits require multiple gate oxide thicknesses. Multiple gate oxide processes include thermal oxidation and wet etching. The wet etching steps of the prior art process result in an undercut region 28 being formed in the buried insulating layer 14; see FIG. 1E. Note that the undercut region 28 is located beneath the top Si-containing layer 16 of the SOI substrate 10.

A gate oxide layer 30 is then formed via oxidation providing the structure shown in FIG. 1F and thereafter a layer of polysilicon 32 is formed via deposition providing the structure shown, for example, in FIG. 1G. The next step in the prior art process comprises a gate stack etch which provides the structure shown in FIG. 1H; in this figure, reference numeral 34 represents the gate polysilicon.

Because of the undercut region 28 that is formed utilizing this prior art process, polysilicon stringers 36 remain in the regions of undercut. The poly silicon stringers 36 that remain in the trench cause gate shorting which limits the use of prior art ultra-thin Si channel devices. FIG. 2 shows a top-down view of the prior art structure produced using the processing steps shown by FIGS. 1A–1H.

In view of the undercut problem that results in stringer formation in the prior art process to isolate ultra-thin Si channel devices, there exists a need for providing a new and improved method to isolate ultra-thin Si channel devices that prevents the formation of polysilicon stringers.

SUMMARY OF INVENTION

One object of the present invention is to provide a method of fabricating an ultra-thin Si channel device having isolation regions in which the formation of an undercut region under the SOI layer is eliminated.

A further object of the present invention is to provide a method of fabricating an ultra-thin Si channel device in which polysilicon stringers are not trapped underneath the active device areas.

A yet further object of the present invention is to provide a method of fabricating an ultra-thin Si channel device in which shorting between gates lying on the same active area is substantially eliminated.

These and other objects and advantages can be achieved in the present invention by utilizing a process in which a chemical oxide removal (COR) step is used to selectively etch sacrificial oxide layers, e.g., thermally grown pad oxide and deposited oxide, from an SOI-containing structure. Specifically, in the present invention, the COR step etches the thermally grown pad oxide, sacrificial oxide and gate oxide layer at a much faster rate than the deposited oxide layer thereby providing an SOI-containing structure having a 'built' in isolation region that comprises remaining deposited oxide not removed by the COR step underneath the SOI layer.

The COR etching step of the present invention does not undercut the top Si-containing layer of the SOI-containing structure. Hence, polysilicon stringer formation is prevented in the present invention by utilizing the COR etching step. The COR step provides an SOI-containing structure including an ultra-thin channel with a built in isolation region that contains deposited oxide that was not completely removed by the COR etching step.

In one aspect of the present invention, a method to fabricate ultra-thin Si channel devices is provided. The method of the present invention includes the steps of:

providing a structure having at least one trench region that includes a recessed, deposited oxide fill material, said at least one trench region is located in a nitride pad layer, a thermally grown oxide pad layer, a top-Si-containing layer of an SOI substrate and a portion of a buried insulating layer of said SOI substrate;

removing said nitride pad layer to expose said thermally grown oxide pad layer; and removing said exposed thermally grown oxide pad layer and a portion of said recessed, deposited oxide fill material utilizing a chemical oxide removal process, said chemical oxide removal process removes the thermally grown oxide at a faster rate than the recessed, deposited oxide to provide a silicon-on-insulator (SOI) structure having an oxide filled trench isolation region, wherein no undercut regions are located beneath the top Si-containing layer.

Due to manufacturing variations, the oxide filled trench isolation regions can be higher or lower than the top Si-containing layer directly after the pad nitride layer is removed. In the case where the oxide filled trench isolation region is lower than the active device region after the pad nitride layer is removed, application of the COR process results in a unique and useful structure which includes a thin SOI layer and a gently sloping oxide structure that prevents the formation of the undercut region as in the prior art. The unique structure is made possible by the self-limiting properties of the COR reaction. The exposed vertical region of the trench liner forms a right angle with the horizontal portion of the trench fill oxide. As the products of the COR reaction form on the vertical oxide and the horizontal oxide, the products preferentially build up in the corner region due to the volume expansion of the reaction product compared to the volume of reacted oxide. Since the products serve to limit the reaction, less oxide is etched in the corner than the horizontal portions of the trench oxide and thereby forming a gently sloping oxide structure and preventing the undercut.

In case where the trench oxide is higher than the active device region, the COR process results in a unique and useful structure which includes a thin SOI layer and a gently sloping oxide structure which prevents the formation of the undercut region as in the prior art. The unique structure is made possible by the self-limiting properties of the COR reaction. The exposed vertical region of the trench oxide forms a right angle with the horizontal portion of the pad oxide. As the products of the COR reaction form on the vertical oxide and the horizontal oxide, the products preferentially build up in the corner region due to the volume expansion of the reaction product compared to the volume of reacted oxide. Since the products serve to limit the reaction, less oxide is etched in the corner than the horizontal portions of the pad oxide and thereby forming a gently sloping oxide structure and preventing the undercut.

Further complementary metal oxide semiconductor processing steps can be utilized to form a transistor region atop exposed portions of the top Si-containing layer.

Another aspect of the present invention is an SOI-containing structure that is formed utilizing the processing steps of the present invention. The structure of the present invention comprises:

a silicon-on-insulator (SOI) comprising at least at top Si-containing layer located on a buried insulating layer; and an oxide filled trench isolation region located in said top Si-containing layer and a portion of said buried insulating layer, wherein no undercut regions are located beneath the top Si-containing layer.

The unique structure of the present invention can include a plurality of transistors located atop the top Si-containing layer of the SOI structure.

BRIEF DESCRIPTION OF DRAWINGS

These and other objects, features and advantages of the present invention will become apparent from the following detailed description and the appended drawings in which.

DETAILED DESCRIPTION

Figure 1A:
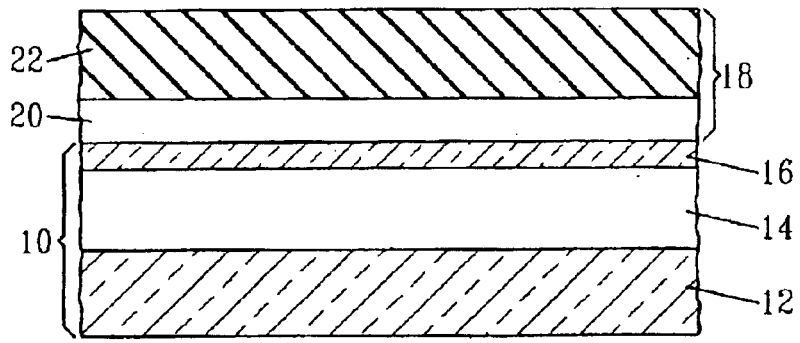
FIGS. 1A–1H are pictorial representations (through cross sectional views) illustrating a prior art process to isolate ultra-thin Si channel devices.
Figure 1B:
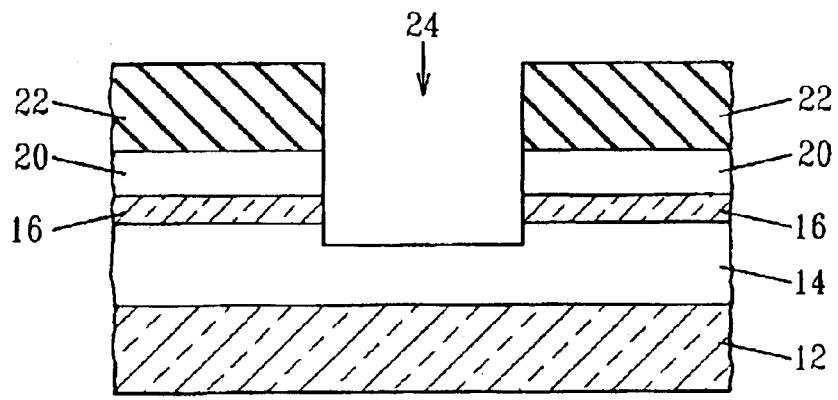
Figure 1C:
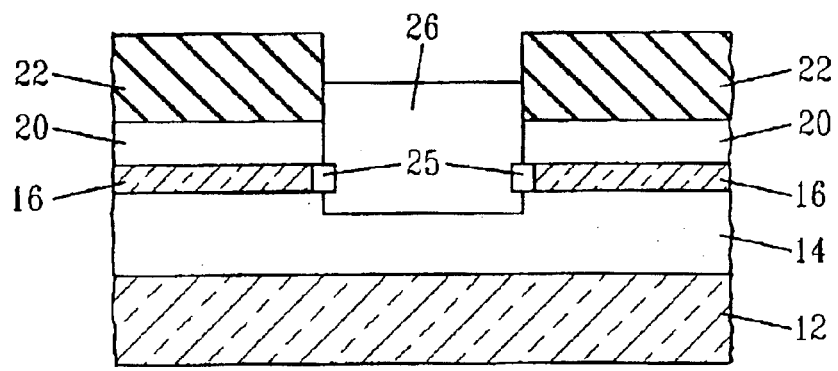
Figure 1D:
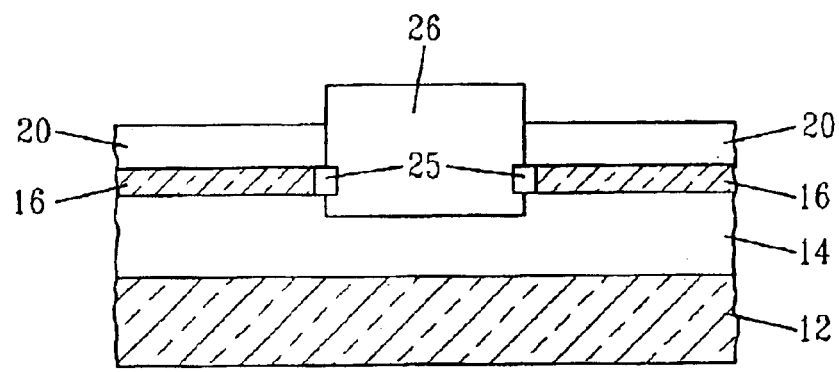
Figure 1E:
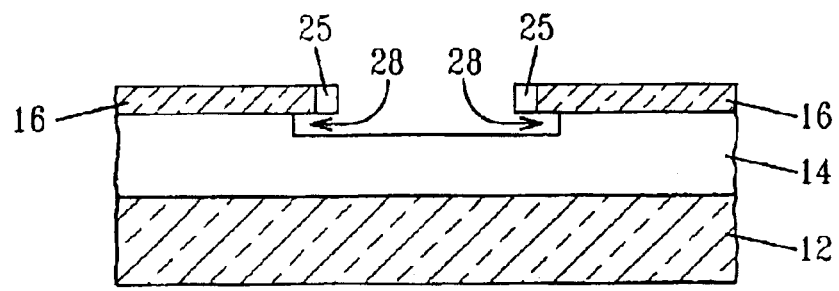
Figure 1F:
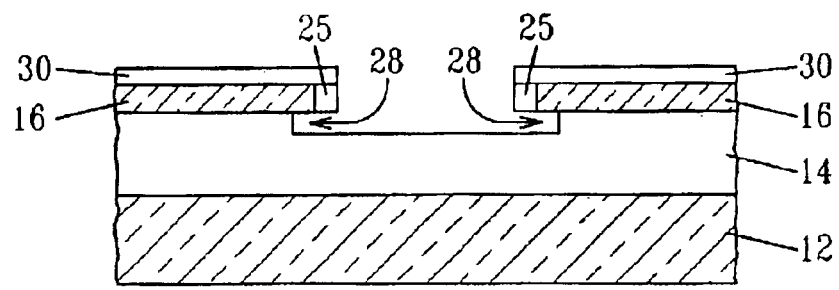
Figure 1G:
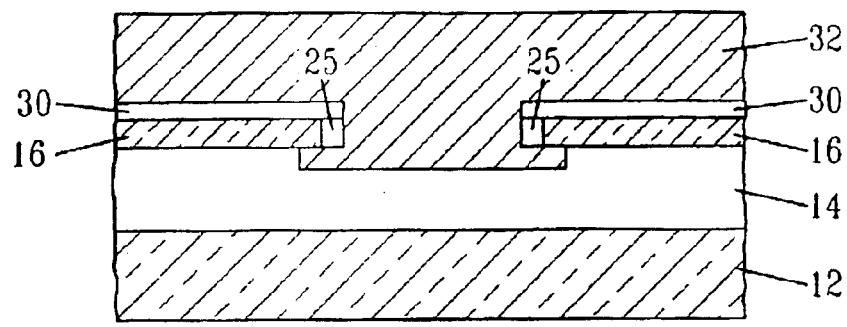
Figure 1H:
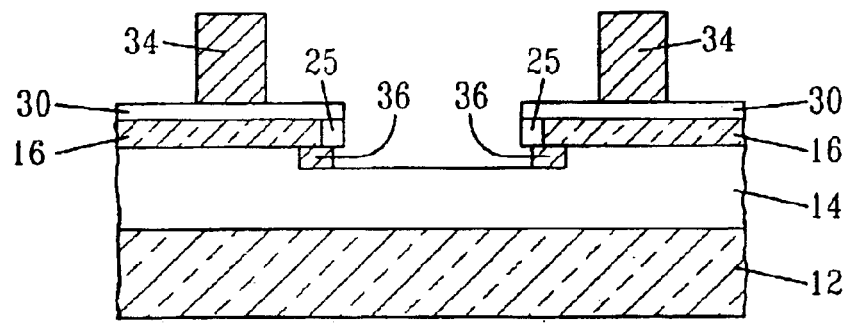
Figure 2:
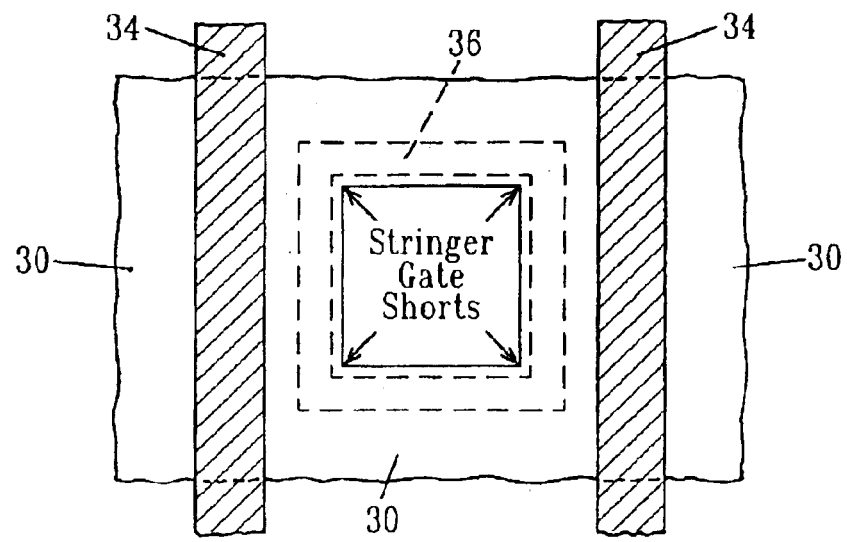
FIG. 2 is a top-down view of the structure that is formed utilizing the prior art process shown in FIGS. 1A–1H.

The present invention, which provides a structure and method to fabricate ultra-thin Si channel devices, will now be described in greater detail by referring to the drawings that accompany the present application.

Figure 3A:
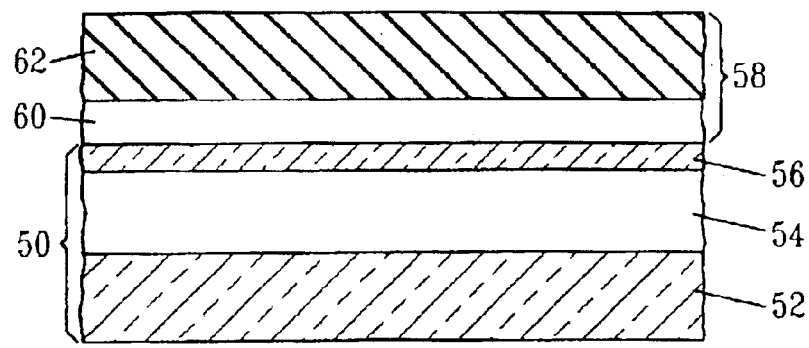
FIGS. 3A–3H are pictorial representations (through cross sectional views) illustrating the basic processing steps of the present invention to fabricate ultra-thin Si channel devices. These drawings show the general concept of the present invention.

FIG. 3A shows an initial structure that is employed in the present invention. The initial structure shown in FIG. 3A includes an SOI substrate 50 having a pad stack 58 located on a surface thereof. The SOI substrate 50 includes a bottom Si-containing layer 52, a buried insulating layer 54, such as an oxide, located atop the bottom Si-containing layer 52, and a top Si-containing layer 56 located atop the buried insulating layer 54. The term "Si-containing layer" is used herein to denote a material that includes silicon. Illustrative examples of Si-containing materials include, but are not limited to: Si, SiGe, SiGeC, SiC, polysilicon, i.e., polySi, epitaxial silicon, i.e., epi-Si, amorphous Si, i.e., a:Si and multilayers thereof. In some embodiments, layers 52 and/or 56 may comprise Ge. A preferred Si-containing material for Si-containing layers 52 and 56 is Si.

The top Si-containing layer 56 of SOI substrate 50 is an ultra-thin layer which has a vertical thickness, $t_v$, i.e. height, of less than about 20 nm, with a vertical thickness of from about 3 nm to about 12 nm being more highly preferred. Portions of the top Si-containing layer 56 which are located beneath the transistor serve as ultra-thin channel regions. The thicknesses of the buried insulating layer 54 and the bottom Si-containing layer 52 are not critical to present invention.

The SOI substrate 50 is fabricated using techniques that are well known to those skilled in the art. For example, the SOI substrate 50 may be fabricated using a thermal bonding process, or alternatively the SOI substrate 50 may be fabricated by an ion implantation process which is referred to in the art as separation by ion implantation of oxygen (SIMOX). When a thermal bonding process is employed in fabricating the SOI substrate 50, an optional thinning step may be utilized to thin the top Si-containing layer 56 into the ultra-thin regime.

The pad stack 58 is then formed on the top Si-containing layer 56 of SOI substrate 50. The pad stack 58 includes a thermally grown pad oxide layer 60 and a pad nitride layer 62 located atop the thermally grown pad oxide layer 60. The thermally grown pad oxide layer 60 is formed by a thermal oxidation process, while the pad nitride layer 62 is formed by a conventional deposition process such as chemical vapor deposition (CVD), plasma-assisted CVD, evaporation, atomic layer deposition, or chemical solution deposition. Alternatively, the pad nitride layer 62 may be formed by a thermal nitridation process. The thermal oxidation process is performed in the presence of an oxygen-containing gas such as steam, $O_2$ or ozone, whereas the thermal nitridation process is performed in the presence of a nitrogen-containing gas such as NO or $N_2$.

The thickness of the thermally grown oxide layer 60 of pad stack 58 may vary depending on the conditions used during the thermal oxidation process. Typically, the thermally grown oxide layer 60 has a thickness of from about 1 nm to about 100 nm, with a thickness of from about 5 nm to about 9 nm being more highly preferred. Insofar as the pad nitride layer 62 of pad stack 58 is concerned, the pad nitride layer 62 has a thickness that is typically greater than the thermally grown pad oxide layer 60. Specifically, the pad nitride layer 62 has a thickness of from about 10 nm to about 200 nm, with a thickness of from about 50 nm to about 120 nm being more highly preferred.

Figure 3B:
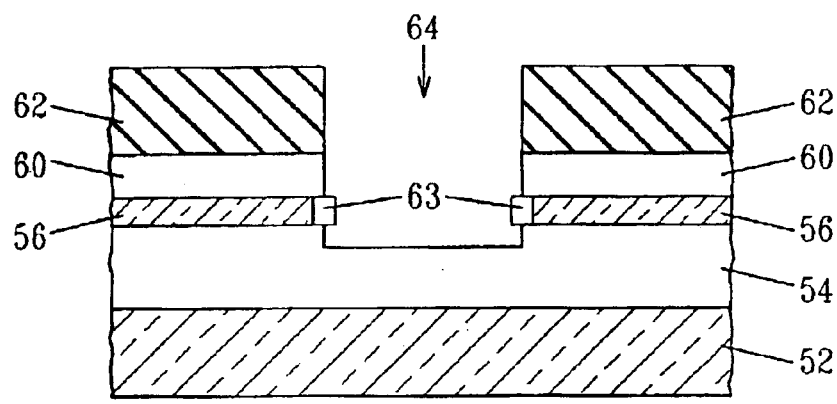

Next, and as is shown in FIG. 3B, at least one trench region 64 is formed into the initial structure shown in FIG. 3A. Despite FIG. 3B showing the presence of only a single trench region, the method of the present invention works equally well when a plurality of trench regions are formed. The at least one trench region 64 is formed utilizing lithography and etching. The lithography step includes applying a photoresist (not shown) to the upper exposed surface of the pad stack 58, i.e., pad nitride layer 62, exposing the photoresist to a pattern of radiation, and developing the pattern into the photoresist utilizing a conventional resist developer. After the pattern is formed in the photoresist, the pattern is transferred first to pad nitride layer 62 utilizing a dry or wet etching process.

When dry etching is performed, reactive-ion etching (RIE), ion beam etching, plasma etching or laser ablation may be employed. When a wet etching process is employed, a chemical etchant that is highly selective in removing the desired material is employed. After transferring the pattern to the pad nitride layer 62, the patterned photoresist may be removed utilizing a conventional stripping process and then etching continues using the patterned nitride layer as an etch mask. As shown, the etching performed at this point of the present invention removes portions of the pad nitride layer 62, the thermally grown oxide layer 60 and the top Si-containing layer 56 stopping within buried insulating layer 54.

Figure 3C:
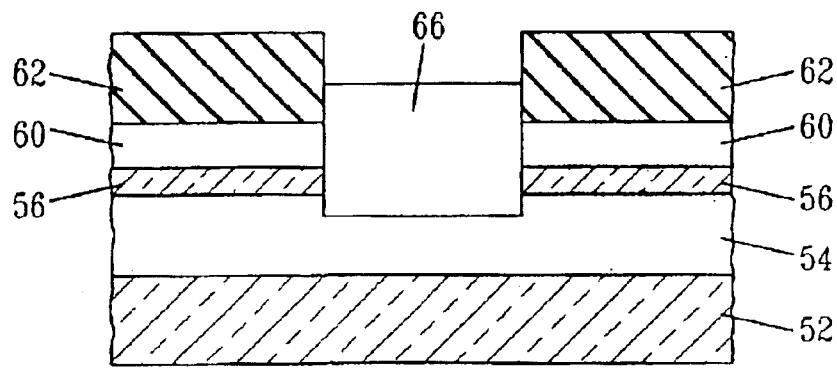
Figure 4A:
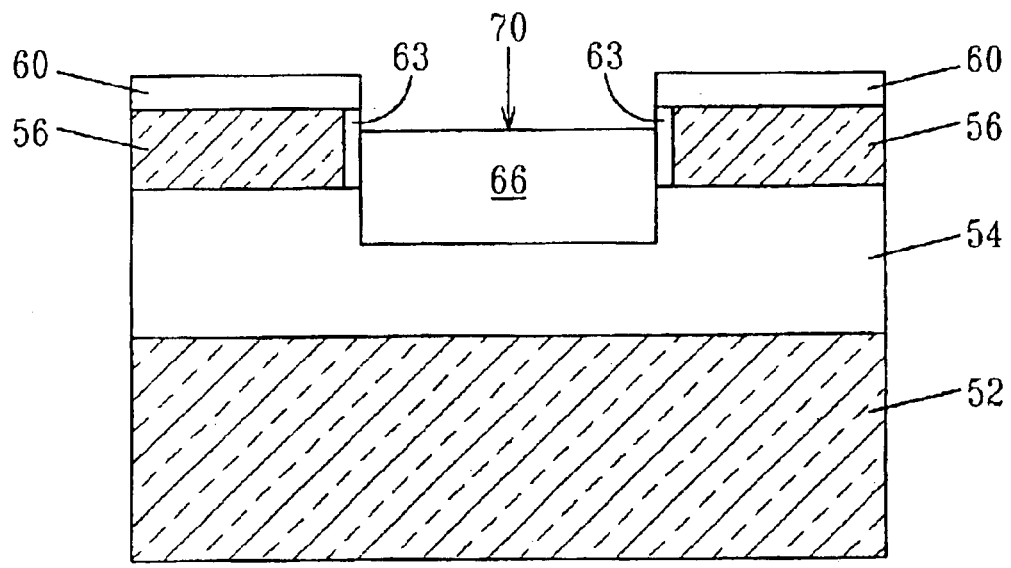
FIGS. 4A–4B are pictorial representations (through cross sectional views) illustrating one possible embodiment of the present invention in which the oxide filled trench is at a lower level than the top Si-containing layer after the nitride pad layer has been removed.
Figure 4B:
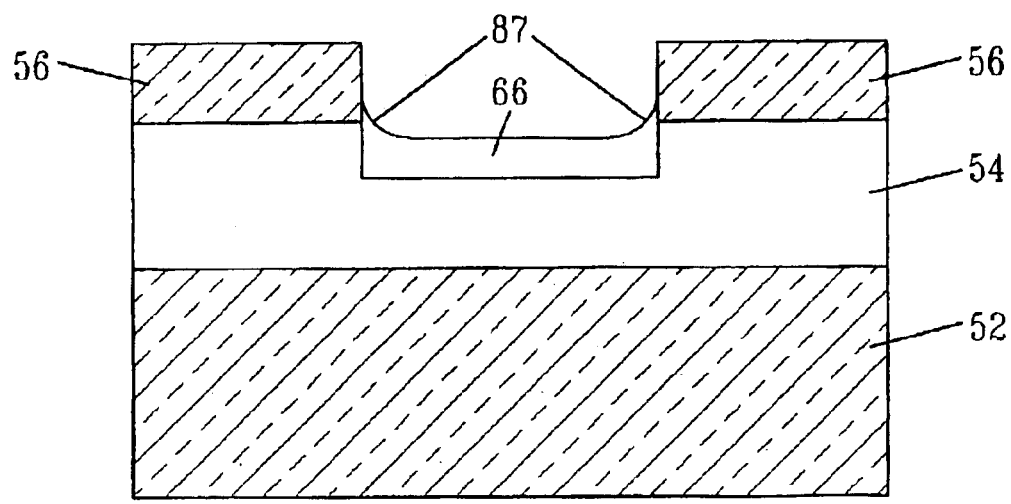

At this point of the present invention, an optional liner 63 (see, FIG. 3B) may be formed on the sidewalls of top Si-containing layer 56. The liner is formed by a conventional thermal oxidation process. For clarity, optional liner 63 is omitted in the remaining cross sectional views, i.e., 3C–3H; in FIGS. 4A–4B and 5A–5B, optional liner 63 is shown. Next, and as is shown in FIG. 3C, a recessed, deposited oxide layer 66 is formed into the at least one trench region 64. Specifically, deposited oxide layer 66 is formed by first depositing a high-density plasma oxide (HPD), SACVD, TEOS or other deposited $SiO_2$ on the structure shown in FIG. 3B. The deposited oxide covers the entire structure including the at least one trench region 64. The deposited oxide is then planarized to the upper surface of the pad nitride layer 62 and then the deposited oxide in the at least one trench region 64 is recessed utilizing a timed etching process. The height of the deposited oxide after the recessing step may vary. For example, the height of the recessed, deposited oxide can be above top Si-containing layer 16 (as shown in FIG. 3C) or it may be below the upper surface of the top Si-containing layer (not specifically, shown in drawings 3A–3H; but shown in FIGS. 4A–4B).

Following formation of the structure shown in FIG. 3C, the pad nitride layer 62 is removed so as to expose underlying portions of the thermally grown pad oxide layer 60. The removal of the pad nitride layer 62 is achieved utilizing an etching step that selectively removes nitride as compared to oxide. For example, hot phosphoric acid can be used to remove the pad nitride layer 62 from the structure. The resultant structure, after pad nitride removal has been performed, is shown, for example in FIG. 3D. Note that a segment of the recessed, deposited oxide layer 66 (hereinafter deposited oxide 66) extends above the upper surface of thermally grown pad oxide layer 60.

Figure 3D:
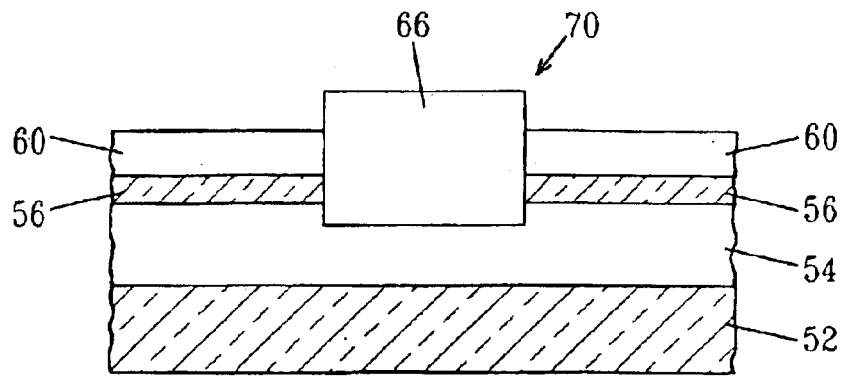

At this point of the present invention, a chemical oxide removal (COR) processing step is performed. The COR processing step selectively etches the thermally grown pad oxide layer 60 from the structure in its entirety, while removing portions of the deposited oxide 66 providing the structure shown, for example, in FIG. 3D. It is noted that FIG. 3D is a general drawing of the structure that is formed after the COR process has been performed. That is, FIG. 3D shows a conceptional view of the structure after the COR step has been performed. The actual structure will look somewhat different from the structure depicted in FIG. 3D. FIGS. 4A–4B and 5A–5B show actual structures that are formed after the COR depending on the height of the deposited oxide.

The COR processing step selectively etches thermally grown oxide at a much faster rate than deposited oxide thereby providing an SOI structure having an exposed top Si-containing layer 56 in which the at least one trench region 64 is filled with the deposited oxide 66; the upper surface of the deposited oxide 66 is not coplanar with the upper surface of the exposed top Si-containing layer 56. The deposited oxide filled trenches serve as the trench isolation regions 70 of the devices of the present invention.

The COR processing step comprises exposing the structure to a gaseous mixture of HF and ammonia at a pressure of about 30 mTorr or below, preferably at a pressure between between about 1 mTorr and about 10 mTorr, and a temperature of about 25° C. or a temperature slightly above room temperature. The ratio of gaseous HF to gaseous ammonia is from about 1:10 to about 10:1, with a ratio of about 2:1 being more highly preferred.

A solid reaction product is formed as a result of the structure's exposure to HF and ammonia gas. The solid reaction product includes etched oxide, reactants or combinations thereof. The solid reaction product is removed m a second step which includes heating the structure to a temperature about 100° C. thus causing the reaction product to evaporate and rinsing the structure in water, or removing with an aqueous solution.

Due to manufacturing variations of the method of the present invention, the trench isolation regions 70 can be higher or lower than the top Si-containing layer 56 directly after the pad nitride layer 62 is removed. In the case where the trench isolation region 70 is lower than the active device region (See FIG. 4A) after the pad nitride layer 62 is removed, application of the COR process results in a unique and useful structure shown in FIG. 4B. The structure includes a thin top Si-containing layer 56, and a gently sloping oxide structure 87 which prevents the formation of the undercut region as in the prior art. The unique structure is made possible by the self-limiting properties of the COR reaction. The exposed vertical region of the trench liner 63 forms a right angle with the horizontal portion of the trench fill oxide 66. As the products of the COR reaction form on the vertical oxide 63 and the horizontal oxide 66, the products preferentially build up in the corner region due to the volume expansion of the reaction product compared to the volume of reacted oxide. Since the products serve to limit the reaction, less oxide is etched in the corner than the horizontal portions of the trench oxide and thereby forming the gently sloping oxide structure 87 and preventing the undercut.

Figure 5A:
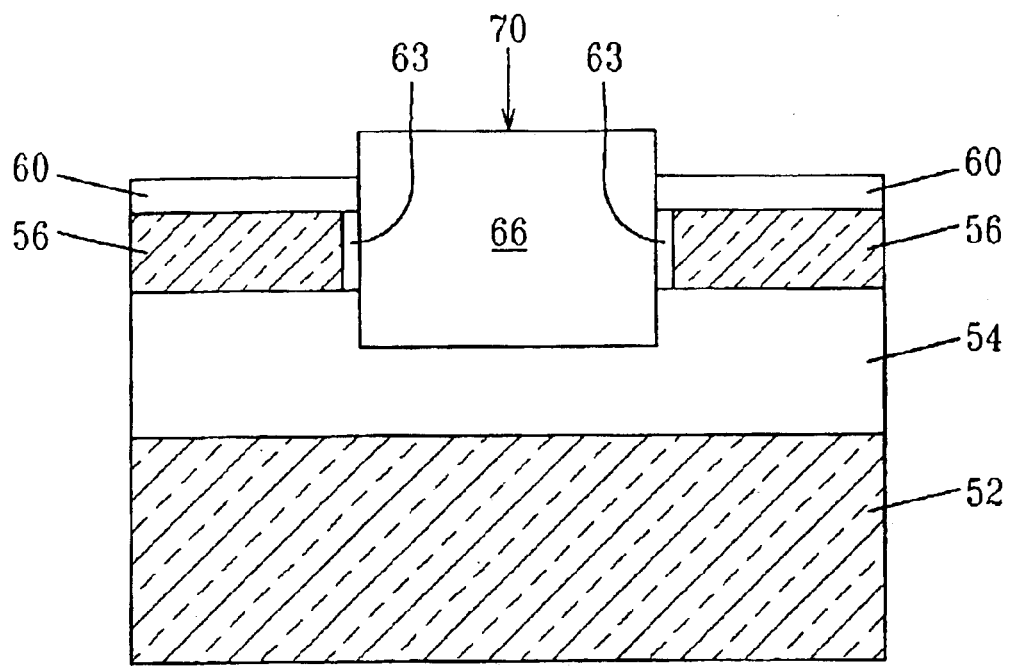
FIGS. 5A–5B are pictorial representations (through cross sectional views) illustrating another possible embodiment of the present invention in which the oxide filled trench is at a higher level than the top Si-containing layer after the nitride pad layer has been removed.
Figure 5B:
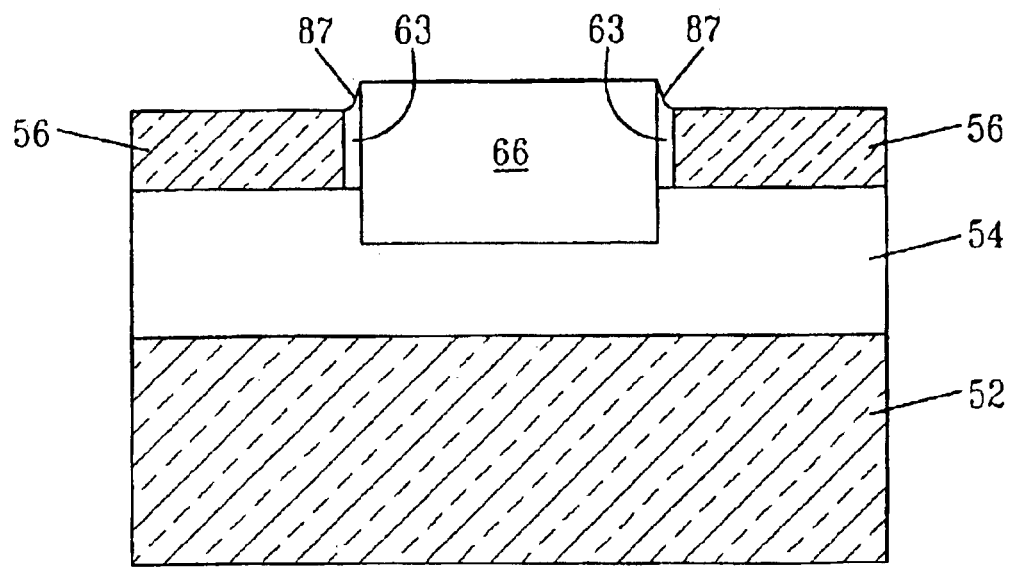

The case where the trench oxide is higher than the active device region is shown in FIG. 5A. In this case, application of the COR process results in a unique and useful structure shown in FIG. 5B. The structure includes a thin Si-containing layer 56, and the gently sloping oxide structure 87 which prevents the formation of the undercut region as in the prior art. The unique structure is made possible by the self-limiting properties of the COR reaction. The exposed vertical region of the trench oxide 66 forms a right angle with the horizontal portion of the pad oxide 60. As the products of the COR reaction form on the vertical oxide 60 and the horizontal oxide 60, the products preferentially build up in the corner region due to the volume expansion of the reaction product compared to the volume of reacted oxide. Since the products serve to limit the reaction, less oxide is etched in the corner than the horizontal portions of the pad oxide and thereby forming the gently sloping oxide structure 87 and preventing the undercut.

Figure 3E:
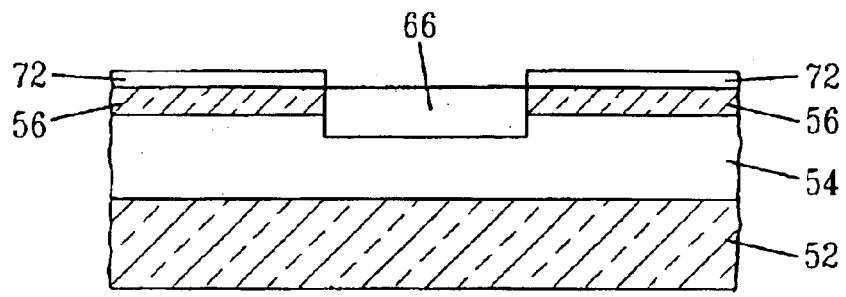

At least one transistor may be formed on the exposed surfaces of the top Si-containing layer 56 of the structure including the trench isolation region 70. The at least one transistor is formed by first planarizing the deposited oxide 66 of the trench isolation region 70 to be coplanar with the upper surface of the pad nitride layer 62. The planarization step is performed utilizing a conventional chemical-mechanical polishing (CMP) process. This planarization step may also be omitted in some applications of the present invention. For the sake of clarity, the remaining drawings illustrate the embodiment wherein planarization is performed at this step of the present invention. Next, the deposited oxide is recessed by a dry or wet or combination dry/wet etch. The pad SiN layer is next removed using a hot phosphoric acid etch. Then the pad oxide is removed using the COR process. An optional sacrificial thermal oxidation process is performed to remove any contamination or structural damage in the Si substrate. If the sacrificial oxidation process is used, a COR process is used to remove the sacrificial oxide at a faster rate than the deposited oxide. A gate dielectric preclean is next done to clean the Si surface prior to gate dielectric formation. A gate dielectric 72 is formed atop the SOI layer 56 providing the structure shown in FIG. 3E.

Gate dielectric 72 is formed on a surface of the structure including top Si-containing layer 56 may be formed by a thermal oxidation, nitridation or oxynitridation processing. Combinations of the aforementioned processes may also be used in forming the gate dielectric 72.

Gate dielectric 72 is comprised of an insulating material including, but not limited to: an oxide, nitride, oxynitride or any combination thereof. A highly preferred insulating material that is employed in the present invention as gate dielectric 72 is $SiO_2$. Although it is preferred to use $SiO_2$ as the gate dielectric material, the present invention also contemplates using insulating materials, i.e., dielectrics, which have a higher or lower dielectric constant, k, than $SiO_2$. For example, the gate dielectric 72 may be comprised of a high-k oxide such as $Al_2O_3$ or a perovskite-type oxide.

The physical thickness of the gate dielectric 72 may vary, but typically the gate dielectric 72 has a thickness of from about 0.5 to about 20 nm, with a thickness of from about 1.0 to about 10.0 nm being more highly preferred.

Figure 3F:
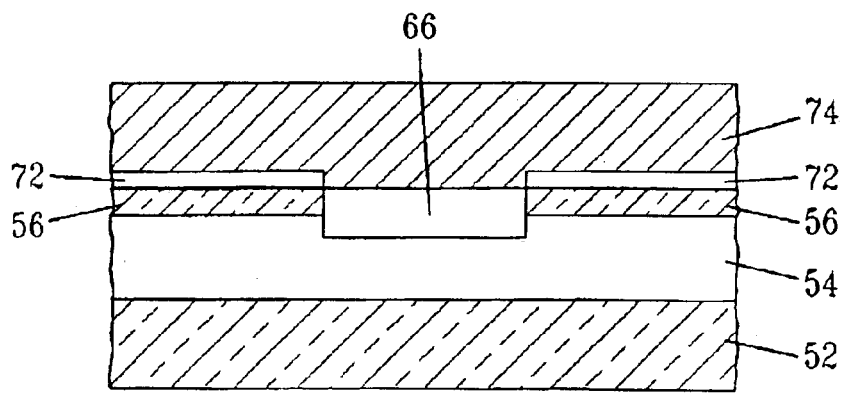

After forming the gate dielectric 72, gate conductor 74 is formed on at least the exposed upper surface of the gate dielectric 72 providing the structure shown in FIG. 3F. Gate conductor 74 is comprised of a conductive material including, but not limited to: elemental metals such as W, Pt, Pd, Ru, Re, Ir, Ta, Mo or combinations and multilayers thereof; silicides and nitrides of the foregoing elemental metals; polysilicon either doped or undoped; and combinations and multilayers thereof. One highly preferred conductive material employed as the gate conductor 74 is doped polysilicon.

Gate conductor 74 is formed utilizing a deposition process such as CVD, plasma-assisted CVD, sputtering, evaporation, chemical solution deposition and plating. When metal silicides are employed, a conventional silicidation process may be used in forming the same. On the other hand, when doped polysilicon is employed as the gate conductor 74, the doped polysilicon may be formed by an in-situ doping deposition process, or alternatively, a layer of undoped silicon is first deposited and thereafter an ion implantation process is employed in doping the undoped polysilicon. The doping of the undoped polysilicon may occur immediately after deposition or in a later processing step.

The physical thickness of gate conductor 74 formed at this point of the present invention may vary depending on the conductive material employed as well as the process used in forming the same. Typically, however, the gate conductor 74 has a thickness of from about 20 to about 400 nm, with a thickness of from about 50 to about 200 nm being more highly preferred.

A hard mask, not shown, may be formed atop the gate conductor 74 prior to patterning the gate conductor. The hard mask may be comprised of an oxide, nitride, oxynitride or any combination thereof.

Figure 3G:
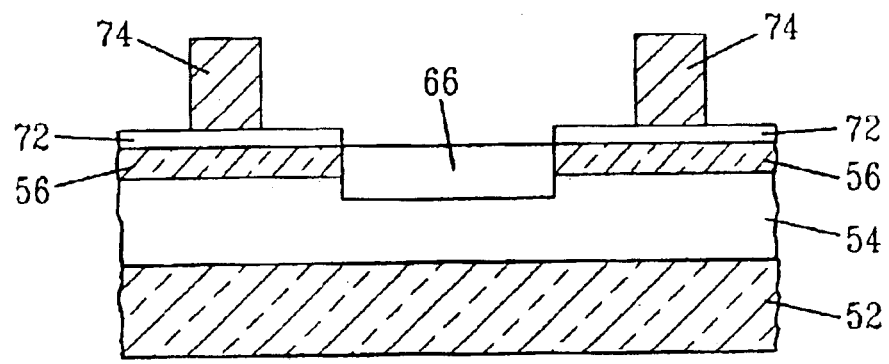

The gate conductor 74 (and optional hard mask) may be patterned at this point of the present invention utilizing lithography and an etching step. The etching step may stop atop the gate dielectric or it may remove the gate dielectric. In embodiments where a hard mask is employed, this etching step may also remove the hard mask from the structure. FIG. 3G shows a structure in which the etching stops atop the gate dielectric 72.

At this point of the present invention, source/drain extensions (not specifically shown) may be formed into portions of the top Si-containing layer 56 by ion implantation and annealing.

Figure 3H:
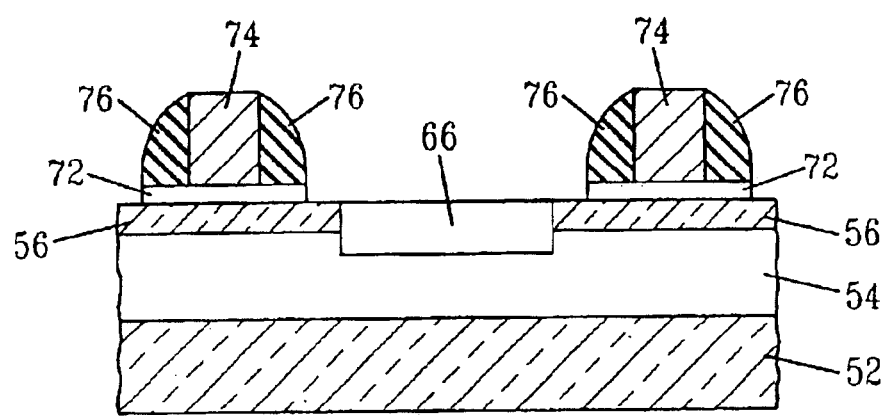

FIG. 3H shows the resultant structure after spacers 76 are formed on at least each sidewall of patterned gate conductor 74. Spacers 76 are comprised of a conventional insulating material such as an oxide, nitride, oxynitride or any combination including multilayers thereof. Preferably, spacers 76 are composed of SiN or $SiO_2$, with SiN spacers being especially preferred in the present invention. The spacers 76 are formed by deposition and etching. Note that the spacers 76 can be formed atop a portion of gate dielectric 72 as shown, or they may be formed directly atop the top Si-containing layer 56 if the gate dielectric was previously removed. In embodiments where the gate dielectric was not previously removed, the unprotected portions of the gate dielectric 72 can be removed during or after the spacer etch. Note also that the hard mask may also be removed during this step of the present invention.

At this point of the present invention, source/drain regions 7 (not shown) may be formed into the top Si-containing layer 56 by ion implantation and annealing. Further CMOS processing steps, including, for example, raised source/drain formation, and silicide formation may be performed.

While the present invention has been particularly shown and described with respect to preferred embodiments thereof, it will be understood by one skilled in the art that the foregoing and other changes in form and detail may be made without departing from the spirit and scope of the present invention. It is therefore intended that the present invention not be limited to the exact forms and details described and illustrated, but fall within the scope of the appended claims.

What is claimed is:

1. A method to fabricate ultra-thin Si channel devices comprising the steps of:
   providing a structure having at least one trench region that includes a recessed, deposited oxide fill material, said at least one trench region is located in a nitride pad layer, a thermally grown oxide pad layer, a top-Si-containing layer of an SOI substrate and a portion of a buried insulating layer of said SOI substrate;
   removing said nitride pad layer to expose said thermally grown oxide pad layer; and
   removing said exposed thermally grown oxide pad layer and a portion of said recessed, deposited oxide fill material utilizing a chemical oxide removal process, said chemical oxide removal process etches the thermally grown oxide at a faster rate than the recessed, deposited oxide to provide a silicon-on-insulator structure having an oxide filled trench isolation region comprising said recessed, deposited oxide that has a height that is above an upper surface of said top Si-containing layer and a sloping oxide structure which has a tapered slope that extends outward from an upper surface of the recessed, deposited oxide to said upper surface of said top Si-containing layer, wherein no undercut regions are located beneath the top Si-containing layer.

2. The method of claim 1 wherein said recessed, deposited oxide fill material is formed by first depositing a deposited oxide layer atop the structure; planarizing the deposited oxide layer to an upper surface of the pad nitride layer; and recessing the planarized deposited oxide layer utilizing a timed etching process.

3. The method of claim 1 wherein said removing of said pad nitride layer is performed utilizing an etching step that selectively removes nitride as compared to oxide.

4. The method of claim 1 wherein said chemical oxide removal process is conducted in a gaseous mixture of HF and ammonia.

5. The method of claim 4 wherein said gaseous mixture of HF and ammonia is used in a ratio of HF to ammonia of from about 1:10 to about 10:1.

6. The method of claim 1 wherein said chemical oxide removal process is conducted at a pressure of about 30 mTorr or less and at temperature of about 25° C.

7. The method of claim 1 further comprising forming a transistor on the top Si-containing layer abutting the oxide filled trench isolation region.

8. A method to fabricate ultra-thin Si channel devices comprising the steps of:
   providing a structure having at least one trench region that includes a recessed, deposited oxide fill material, said at least one trench region is located in a nitride pad layer, a thermally grown oxide pad layer, a top-Si-containing layer of an SOI substrate and a portion of a buried insulating layer of said SOI substrate;
   removing said nitride pad layer to expose said thermally grown oxide pad layer; and
   removing said exposed thermally grown oxide pad layer and a portion of said recessed, deposited oxide fill material utilizing a chemical oxide removal process, said chemical oxide removal process etches the thermally grown oxide at a faster rate than the recessed, deposited oxide to provide a silicon-on-insulator structure having an oxide filled trench isolation region comprising said recessed, deposited oxide that has a height that is below an upper surface of said top Si-containing layer and a sloping oxide structure, wherein no undercut regions are located beneath the top Si-containing layer.

9. The method of claim 8 wherein said recessed, deposited oxide fill material is formed by first depositing a deposited oxide layer atop the structure; planarizing the deposited oxide layer to an upper surface of the pad nitride layer; and recessing the planarized deposited oxide layer utilizing a timed etching process.

10. The method of claim 8 wherein said removing of said pad nitride layer is performed utilizing an etching step that selectively removes nitride as compared to oxide.

11. The method of claim 8 wherein said chemical oxide removal process is conducted in a gaseous mixture of HF and ammonia.

12. The method of claim 11 wherein said gaseous mixture of HF and ammonia is used in a ratio of HF to ammonia of from about 1:10 to about 10:1.

13. The method of claim 8 wherein said chemical oxide removal process is conducted at a pressure of about 30 mTorr or less and at temperature of about 25° C.

14. The method of claim 8 further comprising forming a transistor on the top Si-containing layer abutting the oxide filled trench isolation region.

* * * * *